United States Patent [19]

Yagi

[11] Patent Number: 4,654,585
[45] Date of Patent: Mar. 31, 1987

[54] PHASE DETECTION METHOD
[75] Inventor: Kazuyuki Yagi, Hachioji, Japan
[73] Assignee: Hewlett-Packard Company, Palo Alto, Calif.
[21] Appl. No.: 634,907
[22] Filed: Jul. 26, 1984
[30] Foreign Application Priority Data Jul. 27, 1983 [JP] Japan ................................ 58-137214

[51] Int. Cl.$^4$ .......................... G01R 25/04; H04B 1/68
[52] U.S. Cl. ................... 324/83 Q; 329/112; 307/511; 324/83 FE
[58] Field of Search ................. 324/83 R, 83 Q, 57 Q, 324/83 FE, 83 FM; 329/110, 112; 307/511, 512, 514, 516; 455/260, 265; 343/5 NQ, 17.2 R

[56] References Cited

U.S. PATENT DOCUMENTS

| | | | |
|---|---|---|---|
| 4,048,566 | 9/1977 | Carson | 455/265 |
| 4,196,475 | 4/1980 | Hall | 369/982 |
| 4,253,118 | 2/1981 | Flasza | 455/265 |
| 4,306,297 | 12/1981 | Sugihara | 328/133 |
| 4,409,543 | 10/1983 | Sugihara | 324/83 Q |
| 4,459,543 | 7/1984 | McNeil | 324/83 R |

OTHER PUBLICATIONS

Hall, Henry P. "An AC-DC Ratiometric and its Use in a CRL Meter"–IEEE Trans. on Inst. & Measurement-- Dec. 1973, pp. 387–390.

Primary Examiner—Reinhard J. Eisenzopf
Assistant Examiner—Jose M. Solis
Attorney, Agent, or Firm—Douglas A. Kundrat

[57] ABSTRACT

A phase detection method for use, e.g., in impedance measurements, permits accurate phase detections to be performed at a high measurement speed. Two reference signals, phase shifted by 90° from each other, and an input signal are applied to two phase detectors and phase detection is performed. The two reference signals are then both incrementally phase shifted by a predetermined amount and the measurements are again made. Phase incrementation and measurements are repeated until the original phase is reattained and the measurements are then averaged.

5 Claims, 9 Drawing Figures

PHASE DETECTION METHOD

BACKGROUND AND SUMMARY OF THE INVENTION

Phase detection of an electrical signal may be used to measure the real and imaginary components of the impedance of an electrical device under test. For convenience, it is desirable that the time necessary to perform the phase detection be kept short and for accuracy it is desirable that detection errors be kept to a minimum.

Phase detection, as performed in the prior art, has been accomplished with the use of a switched single detector as is described in Laid Open Japanese Patent No. 30375/1978. While high degrees of measurement accuracy may be achieved with the use of such a switched single detector, the phase detection method tends to be very time-consuming.

In accordance with the illustrated preferred embodiment of the present invention, a phase detection method permits rapid phase detection to be accomplished with a high degree of measurement accuracy. A dual detector apparatus is utilized to make phase measurements of two unknown signals relative to a reference signal. Repeated measurements of the two unknown signals are made and an incremental phase shift is injected between successive measurements. The individual measurements are averaged to yield a highly accurate phase measurement.

DETAILED DESCRIPTION OF THE PREFERRED EMBODIMENT

Phase detection may be used to detect the 0° (in-phase) and the 90° (quadrature) components of an unknown signal with respect to a known reference signal. In an impedance measuring device, the unknown signal may represent the magnitude of the impedance of a device under test (such as a capacitor or an inductor) and the separate in-phase and quadrature components then correspond separately to the resistance and reactance of the device. In order to determine the resistance and reactance components precisely, the phase detection of the in-phase and quadrature components must be made accurately.

Figure 1:
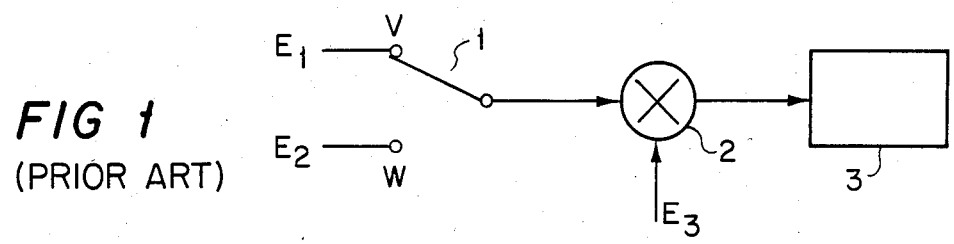
FIG. 1 is a block diagram of a phase detection circuit which is constructed in accordance with the prior art.
Figure 2:
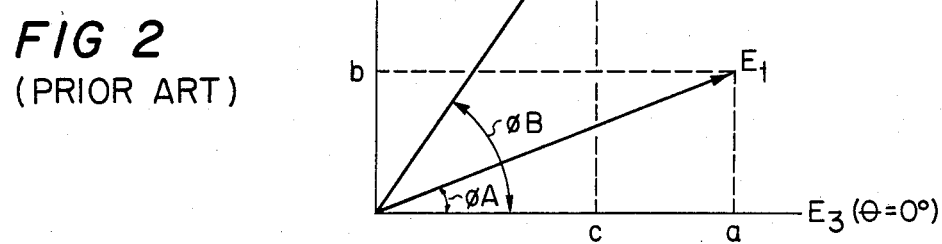
FIG. 2 is a vector diagram which depicts the relationship between the two input signals shown in FIG. 1.

FIG. 1 shows a prior art phase detection circuit and FIG. 2 shows the relationship between the two input signals (unknown signals $E_1$ and $E_2$) shown therein.

Figure 3:
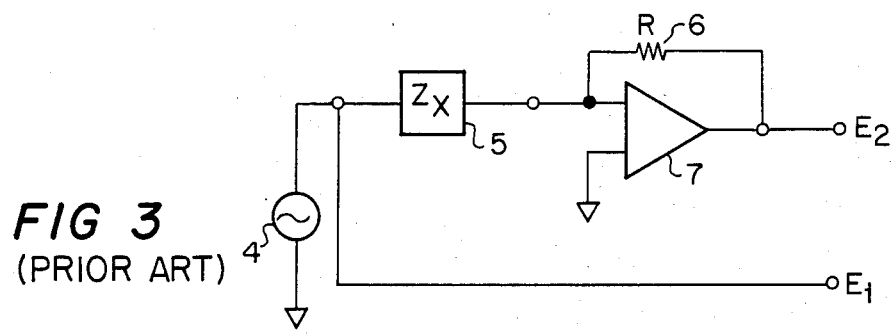
FIG. 3 is a schematic diagram of a circuit which may be used to generate the two input signals shown in FIG. 1.

FIG. 3 shows a circuit which may be used to generate the two input signals, $E_1$ and $E_2$ in an impedance measurement system. An input signal source 4 is connected to a high gain operational amplifier 7 through a device to be tested 5 (capacitor, inductor or the like). Resistor 6 provides negative feed back around op amp 7. Signals $E_1$ and $E_2$ are related by:

$$E_2 = \frac{R}{x + jY} E_1, \tag{1}$$

wherein X is the resistance component of the impedance of the device 5, Y is the reactance component and R is the resistance of resistor 6. $E_3$ (in FIG. 2) is a reference signal which is supplied by signal source 4 as:

$$E_3 = \sin(\omega t - \theta). \tag{2}$$

Therefore, signals $E_1$ and $E_2$ may be expressed as:

$$E_1 = A \sin(\omega t + \phi_A), \tag{3}$$

$$E_2 = B \sin(\omega t + \phi_B), \tag{4}$$

wherein $\phi_A$ represents phase shifts caused by, e.g., long lead lines, and $\phi_B$ represents the phase shift of the reactance of the device under test 5.

In FIG. 1, either signal $E_1$ or signal $E_2$ may be applied through a switch 1 to an input of a phase detector 2. Reference signal $E_3$ may be applied to another input of the phase detector 2. The output signal of the phase detector 2 is applied to an output circuit 3 which may include an analog to digital converter as is described hereinafter.

Phase detection of the two unknown signals $E_1$ and $E_2$ is accomplished in accordance with the prior art by first setting the switch 1 to point v to apply the unknown signal $E_1$ to phase detector 2. The in-phase ($\theta = 0°$) component (a) of signal $E_1$ and then the quadrature ($\theta = 90°$) component (b) of $E_1$ are measured. The switch 1 is then set to point w to apply the unknown signal $E_2$ to phase detector 2 and the in-phase and quadrature components (c and d) of signal $E_2$ are measured. The various components (a, b, c, d) are obtained in a time-division manner. A dual slope integrator may be used to perform the analog to digital conversion in the output circuit 3 and the components a, b, c, d may be integrated for a predetermined time $T_1$ and may be then discharged at a DC voltage (e). The magnitudes of the components a, b, c, d are found by counting discharged times $T_2$, $T_3$, $T_4$, and $T_5$.

Figure 4:
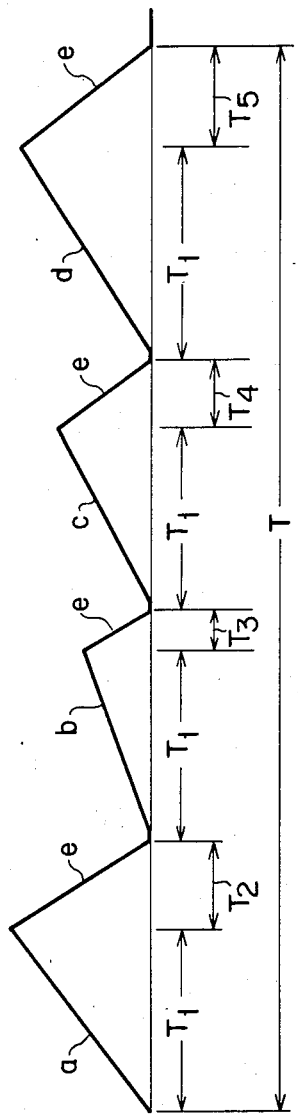
FIG. 4 shows the operation of the circuit shown in FIG. 1.

FIG. 4 depicts the operation of the output circuit 3 shown in FIG. 1. Using well-known dual-slope integration techniques, a vector voltage ratio and, thus, the resistance and reactance components of the impedance of the device 5 may be obtained in accordance with Equations 5-7:

$$\left| \frac{E_2}{E_1} \right| = \sqrt{\frac{c^2 + d^2}{a^2 + b^2}} \tag{5}$$

$$X = \frac{T_2 T_3 + T_4 T_5}{T_2^2 + T_4^2} \tag{6}$$

$$Y = \frac{T_2 T_5 - T_3 T_4}{T_2^2 + T_4^2} \quad (7)$$

The above-described technique is disclosed in Laid Open Japanese Pat. No. 30375/1978. Switching between $\theta=0°$ and $\theta=90°$ may be accomplished by clocking the reference signal $E_3$ as is disclosed in the method shown in Laid Open Japanese Pat. No. 72657/1979. Since the clock signal may be controlled very accurately, the necessary conditions of $\theta=0°$ and $\theta=90°$ may be held very accurately for a highly accurate phase detection measurement. However, since this prior art method utilizes a single phase detector for the measurement of components a, b, c, d, in a time-division manner, measurement speed is very low.

Figure 5:
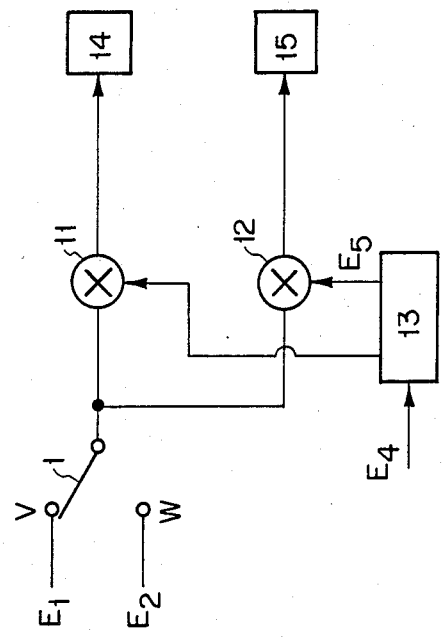
FIG. 5 is a block diagram of another phase detection circuit which is constructed in accordance with the prior art.

FIG. 5 shows another apparatus which is constructed in accordance with the prior art. Phase detectors 11 and 12 each have one input which is connected to switch 1 and another which is connected to a phase signal generator 13. The outputs of the phase detectors 11, 12 are connected to output circuits 14 and 15. Each of the output circuits 14 and 15 may include an analog to digital converter which may be similar to the converter discussed above with reference to FIG. 1. The phase signal generator 13 generates a reference signal $E_4$ and a shifted reference signal $E_5$ which is phase shifted from reference signal $E_4$ by 90°.

$$E_4 = \sin(\omega t - \phi) \text{ and } E_5 = (1+\alpha)\cos(\omega - \theta - \epsilon), \quad (8)$$

wherein $\epsilon$ is an error term representing the difference between the desired 90° phase shift and the phase shift actually existing between signals $E_4$ and $E_5$. $\alpha$ is a calibration error term representing the difference in the accuracies of phase detectors 11 and 12.

Figure 6:
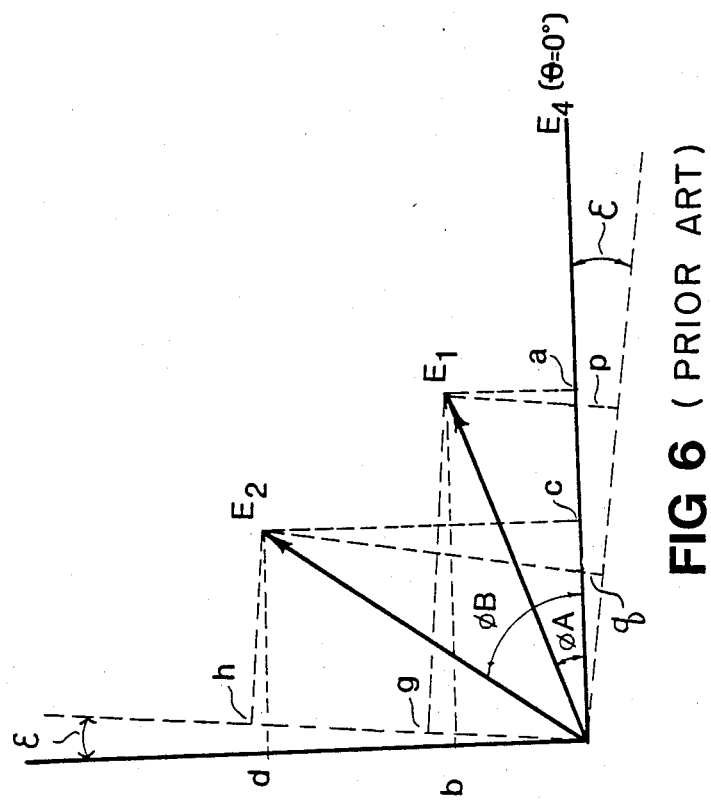
FIG. 6 is a vector diagram which shows the relationship between the two input signals shown in FIG. 5.

FIG. 6 is a vector diagram which shows $E_1$ and $E_2$ with respect to the reference signal $E_4$ ($\theta=0°$). When the switch 1 in FIG. 5 is set to point v, the outputs of phase detectors 11 and 12 are signals $X_A$ and $Y_A$, respectively.

$$X_A = A \cos(\phi_A + \theta) \quad (9)$$

$$Y_A = A(1+\alpha)\sin(\phi_A + \theta + \epsilon) \quad (10)$$

If $\theta=0°$, then $X_A=a=A\cos\phi_A$ and $Y_A=g=A(1+\alpha)\sin(\phi_A+\epsilon)$ and it can be seen that errors $\alpha$ and $\epsilon$ are contained in g. Likewise, if switch 1 is set to point w ($\theta=0°$) the outputs of phase detectors 11 and 12 are signals $X_B$ and $Y_B$, respectively.

$$X_B = c + B\cos\phi_B \quad (11)$$

$$Y_B = h = B(1+\alpha)\sin(\phi_B + \epsilon) \quad (12)$$

Although this prior art phase detection method is faster than the prior art method first discussed above with reference to FIG. 1, it disadvantageously produces errors $\alpha$ and $\epsilon$ in the measurement of the absolute magnitude of the vector voltage ratio of $E_2/E_1$ and in the measurement of signals X and Y.

The prior art phase detection apparatus shown in FIG. 5 may also be used in the performance of the method in accordance with the illustrated preferred embodiment of the present invention. If $E_4=\sin(\omega t-\theta)$ and $E_5=(1+\alpha)\cos(\omega t-\theta-\epsilon)$, then accurate measurements may be obtained from phase detectors 11 and 12 by phase shifting $\theta$ successively and accurately by a predetermined amount. $\theta$ and the total number of the measurements, N, are related by:

$$\theta = i(1\pi/N), \quad (13)$$

wherein i is varied from 0 to $N-1$. For instance, if $N=4$ (i=0, 1, 2, 3), the phase detection measurement is made four times with $\theta$ shifted by 90° between succeeding measurements. Thus, $X_A$ and $Y_A$ are related by:

$$X_A\left(\frac{2\pi}{N}i\right) = A\cos\left(\phi_A + \frac{2\pi}{N}i\right), \quad (14)$$

$$Y_A\left(\frac{2\pi}{N}i\right) = A(1+\alpha)\sin\left(\phi_A + \frac{2\pi}{N}i + \epsilon\right). \quad (15)$$

The vector voltage ratio between the unknown signals $E_1$ and $E_2$ is:

$$\left|\frac{E_2}{E_1}\right| = \frac{1}{N}\sum_{i=0}^{N-1}\sqrt{\frac{X_B^2\left(\frac{2\pi}{N}i\right) + Y_B^2\left(\frac{2\pi}{N}i\right)}{X_A^2\left(\frac{2\pi}{N}i\right)Y_A^2\left(\frac{2\pi}{N}i\right)}}. \quad (16)$$

For $N=4$, the four terms $X_A$, $Y_A$, and $X_B$, $Y_B$, are each measured at $\theta=0°$, 90°, 180° and 270°, and four values of $E_2/E_1$ are computed and the four values are then averaged in accordance with Equation 16. Thus, for $N=4$, the $\alpha$ and $\epsilon$ errors can each be reduced by a factor of approximately fifty, thereby improving the precision of the measurement by the same factor. For $N=8$, the $\alpha$ and $\epsilon$ errors can each be reduced by a factor of approximately 250,000.

Figure 7A:
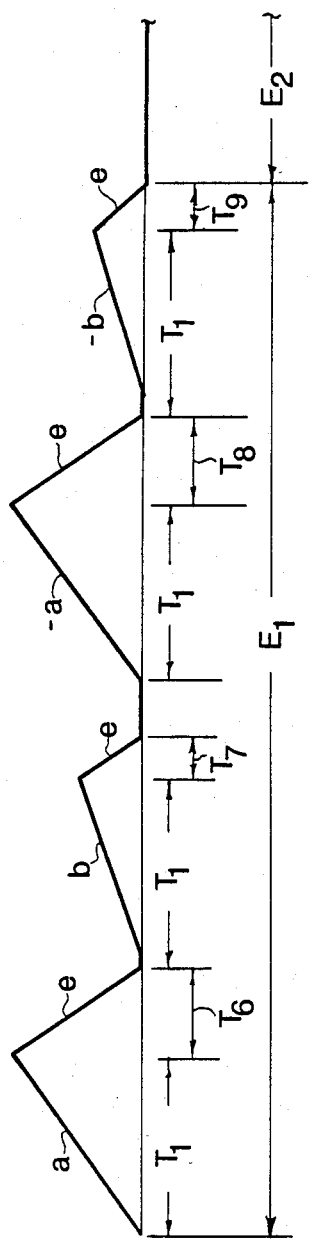
FIGS. 7a and 7b show the operation of the circuit shown in FIG. 5.
Figure 7B:
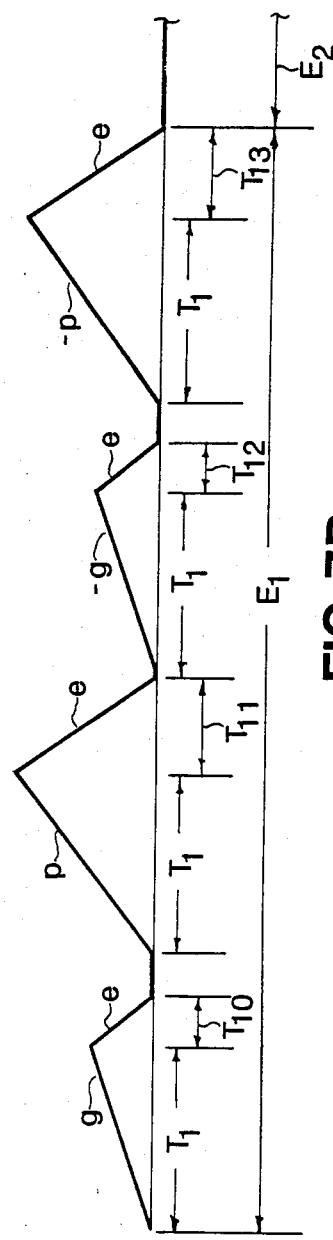

Outputs circuits 14 and 15, shown in FIG. 5, include dual slope analog to digital converters which operate as is shown in FIGS. 7A–B for $N=4$. FIG. 7A shows the sequence of operations performed by the analog to digital converter of output circuit 14 and FIG. 7B depicts the sequence of operations performed by the analog to digital converter of output circuit 15 for the condition in which the switch 1 is set to point v.

The digital measurement of time intervals $T_6-T_{13}$ digitizes terms $X_A$ and $Y_A$ by means of dual slope integration. The digitized $X_A$ and $Y_A$ terms may then be supplied to an arithmetic logic unit (not shown) for calculation of the desired phase or impedance quantity to a high degree of accuracy.

Because two phase detectors are used in the method according to the prepared embodiment of the present invention, instead of one as in the prior art methods, twice as much time may be spent on the measurement of each of the in-phase and quadrature components. Thus, for the same measurement speed as that obtained in the prior art, the measurement signal-to-noise ratio may be improved by a factor of two. Conversely, measurement speed may be doubled for the same measurement signal-to-noise ratio.

Figure 8:
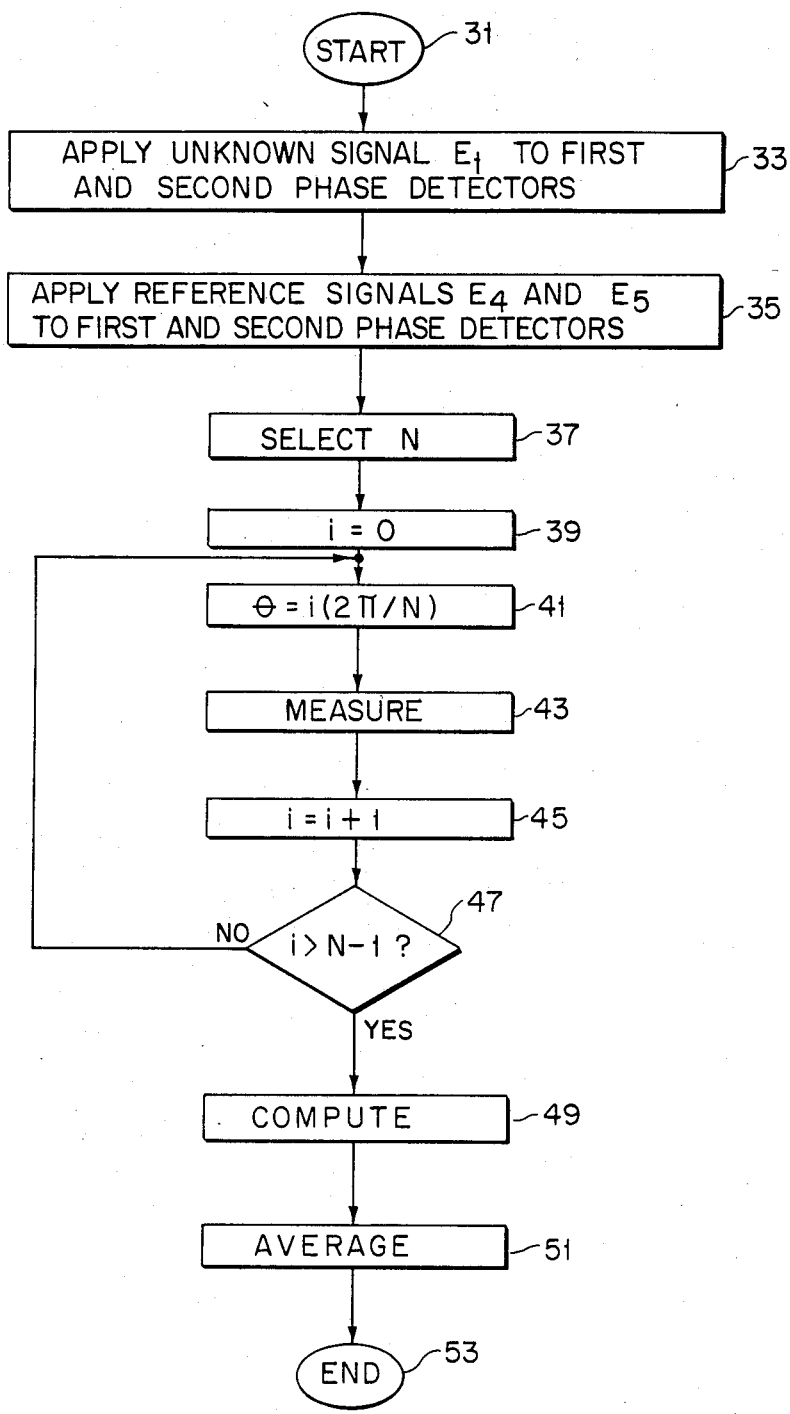
FIG. 8 is a flow chart of the method in accordance with the preferred embodiment of the present invention.

FIG. 8 is a flow chart of the steps of the method in accordance with the illustrated preferred embodiment of the present invention. In steps 33 and 35, the signals $E_1$, $E_4$ and $E_5$ are applied to the two phase detectors 11, 12 shown in FIG. 5 by setting switch 1 to position v.

Signals $E_4$ and $E_5$ are identical except that there is a relative phase shift of 90° therebetween. In step 37, N is selected for the desired increment by which successive phase shifts are to be made to signals $E_4$ and $E_5$. In step 39, i is initialized. In step 41, the successive phase shift from the preceeding measurement set is made to signals $E_4$ and $E_5$. Of course, in the initial measurement set the phase shift is zero.

In step 43, the desired measurements are made. Well-known dual slope integration techniques, such as that disclosed in U.S. Pat. No. 4,196,475 (incorporated herein by reference) and in "An AC-DC Ratiometer And It's Use In A CRL Meter" by Henry Hall in the December, 1973, IEEE Transactions on Instrumentation and Measurements, may be used. As described above, it may be desirable to measure the two quantities (defined in Equations 9 and 10) $X_A$, $Y_A$. In steps 45 and 47, i is incremented and new measurement sets are made if i is less than N. These new measurement sets are made with the phases of signals $E_4$ and $E_5$ shifted as defined above with respect to Equation 13.

Once i reaches N, no more measurement sets are made and, in step 49, the N individual computations of equation 16 are made for $i=0$ through $i=N-1$. Finally, in step 51, the average of Equation 16 over the N computations is made. Before step 49, the steps 31-47 may be repeated for signals $E_2$, $E_4$, $E_5$ in order to measure the in-phase and quadrature components of the signal $E_2$ in the manner in which the in-phase and quadrature components of the signal $E_1$ were measured.

I claim:

1. A phase detection method comprising the steps of:
   (a) applying a first unknown signal to first and second phase detectors;
   (b) applying a reference signal to the first phase detector;
   (c) applying a shifted reference signal, phase shifted substantially 90 degrees from the reference signal and substantially identical thereto, to the second phase detector;
   (d) measuring the in-phase portion of the first unknown signal relative to the reference signal;
   (e) measuring the quadrature portion of the first unknown signal relative to the shifted reference signal;
   (f) shifting both the reference signal and the shifted reference signal by a predetermined shift phase angle substantially equal to 360 degrees divided by N, wherein N is a predetermined desired number of measurements;
   (g) repeating steps d-f until the N predetermined desired number of measurements have been made;
   (h) calculating a measured result from the measured in-phase and quadrature portions; and
   (i) averaging the measured results.

2. A method as in claim 1, wherein steps d and e are performed by means of dual slope integration.

3. A method as in claim 1, wherein step a-g are subsequently repeated for a second unknown signal.

4. A method as in claim 3, wherein:
   the first unknown signal represents the voltage across an unknown device; and
   the second unknown signal represents the current through the unknown device.

5. A method as in claim 4, further comprising the step of calculating the impedance of the unknown device.

* * * * *

UNITED STATES PATENT AND TRADEMARK OFFICE
CERTIFICATE OF CORRECTION

PATENT NO. : 4,654,585
DATED : March 31, 1987
INVENTOR(S) : Kazuyuki Yagi

It is certified that error appears in the above-identified patent and that said Letters Patent is hereby corrected as shown below:

Column 3, line 30 "$E_4=\sin(\omega t-\phi)$ and $E_5=(1+\alpha)\cos(\omega-\theta-\epsilon)$," should read -- $E_4 = \sin(\omega t - \phi)$ and $E_5 = (1+\alpha)\cos(\omega t - \theta - \epsilon)$ --

Column 4, line 4, "$\theta=i(1\pi/N)$" should read -- $\theta=i(2\pi/N)$ --

Column 6, line 26, "wherein stepa a-g" should read -- wherein steps a-g --

Signed and Sealed this

Twenty-fourth Day of November, 1987

*Attest:*

DONALD J. QUIGG

*Attesting Officer*  *Commissioner of Patents and Trademarks*